US006657870B1

(12) United States Patent
Ali et al.

(10) Patent No.: US 6,657,870 B1
(45) Date of Patent: Dec. 2, 2003

(54) DIE POWER DISTRIBUTION SYSTEM

(75) Inventors: Anwar Ali, San Jose, CA (US); Benjamin Mbouombouo, San Jose, CA (US); Max Yeung, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 4 days.

(21) Appl. No.: 09/968,286

(22) Filed: Oct. 1, 2001

(51) Int. Cl.[7] .............................. H05K 7/02; H05K 7/06; H05K 7/08; H05K 7/10
(52) U.S. Cl. ..................... 361/760; 361/777; 361/794; 174/250; 257/776
(58) Field of Search .................... 361/760–764, 361/777–779, 780, 783, 794; 257/676, 691, 783; 174/250, 255–261, 251

(56) References Cited

U.S. PATENT DOCUMENTS

| 4,677,526 | A | * | 6/1987 | Muehling ................... 361/718 |
| 5,069,626 | A | * | 12/1991 | Patterson et al. ............. 439/55 |
| 5,596,224 | A | * | 1/1997 | Murphy et al. ............. 257/666 |
| 6,476,466 | B2 | * | 11/2002 | Fujisawa et al. ............ 257/666 |
| 6,483,714 | B1 | * | 11/2002 | Kabumoto et al. ......... 361/760 |

* cited by examiner

Primary Examiner—Kamand Cuneo
Assistant Examiner—Tuan Dinh
(74) Attorney, Agent, or Firm—Sawyer Law Group

(57) ABSTRACT

A power distribution system for distributing external power across a die is disclosed, wherein the die has horizontal and vertical centerlines. The system and method include providing a power mesh that includes a plurality of V-shaped trunks patterned as concentric diagonal trunks extending from the horizontal and vertical centerlines of the die towards the periphery of the die.

14 Claims, 5 Drawing Sheets

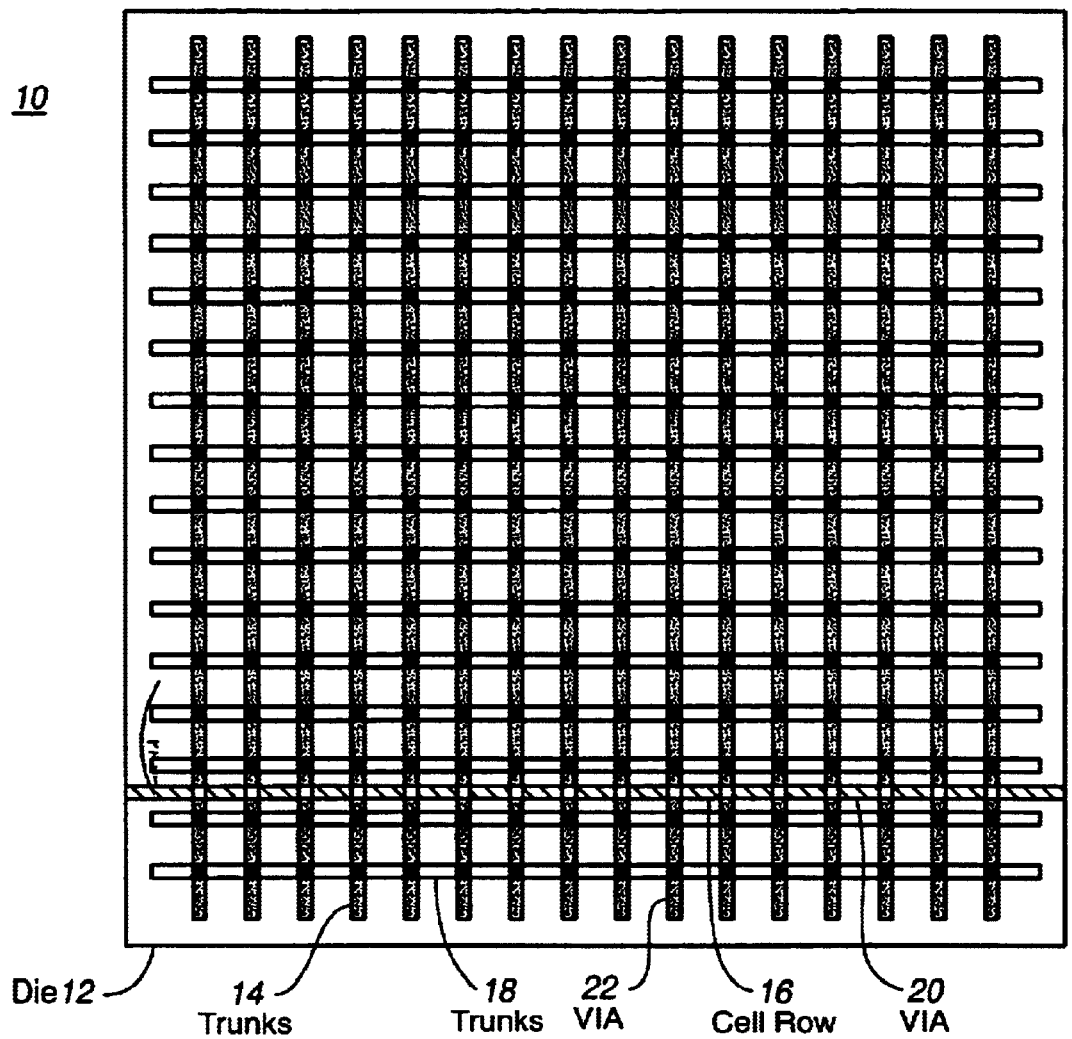
FIG._1 (PRIOR ART)
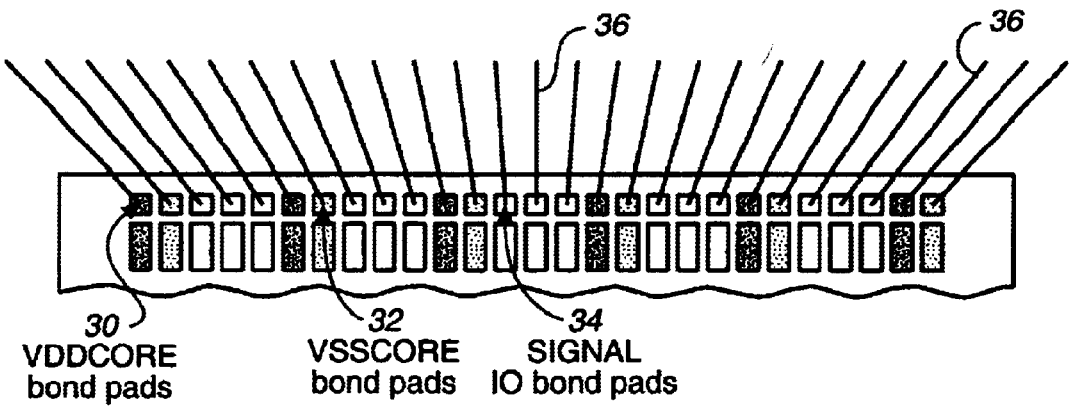
FIG._2 (PRIOR ART)

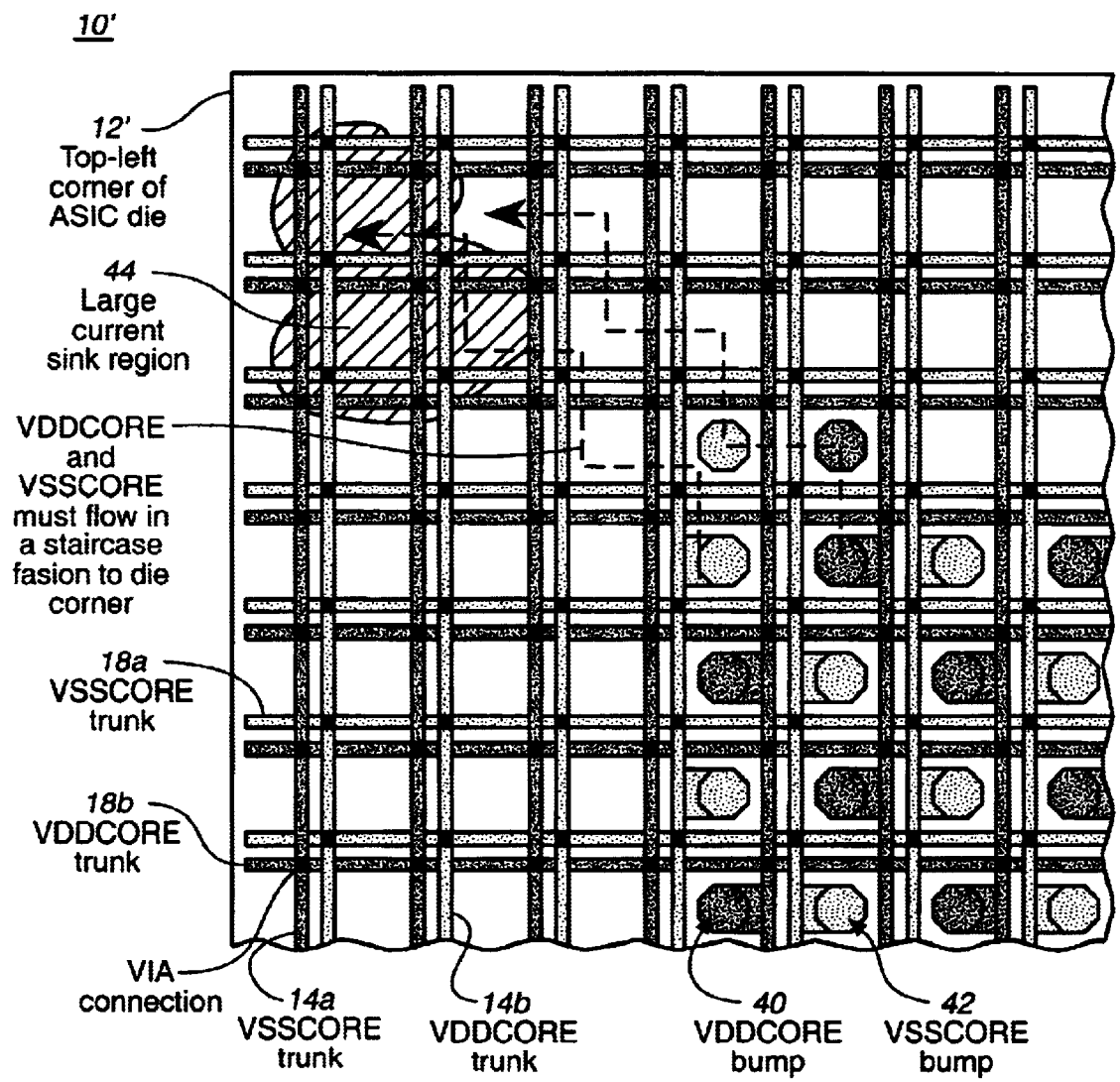
FIG._3 (PRIOR ART)

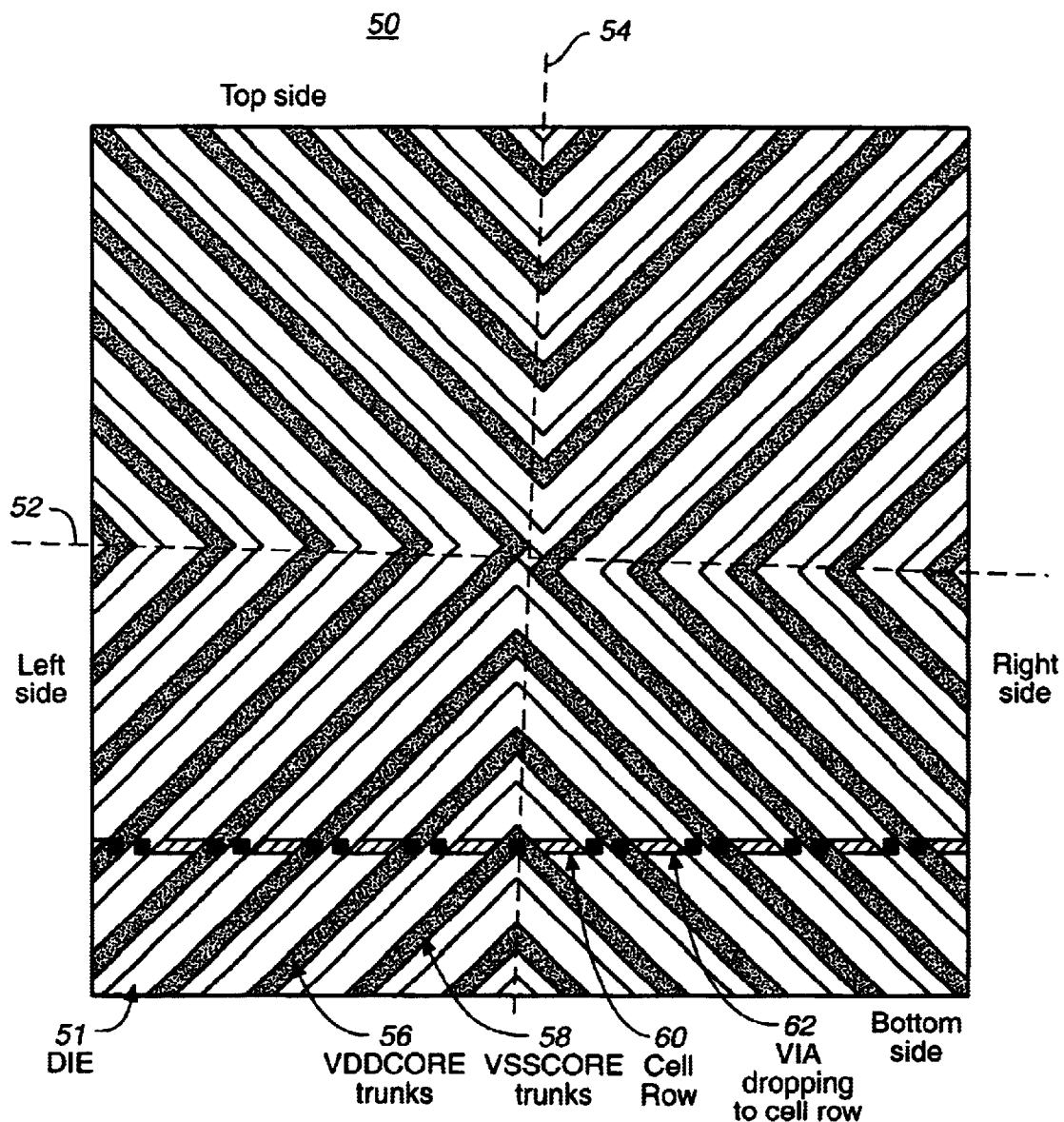
FIG._4

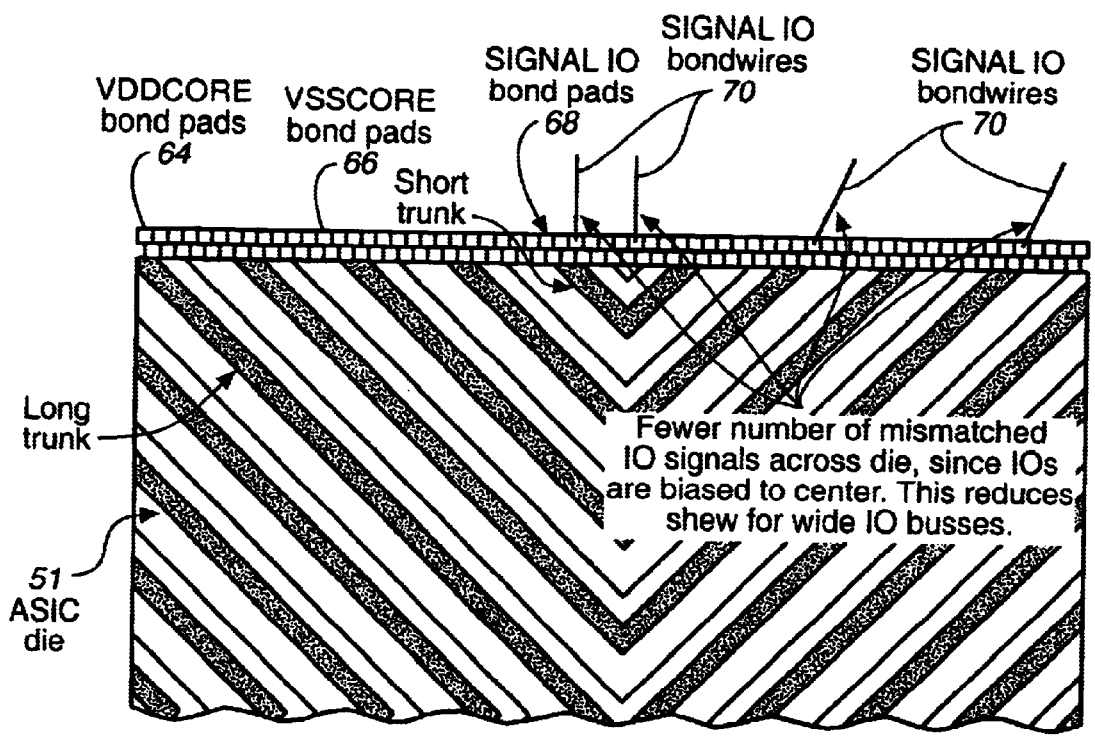
FIG._5
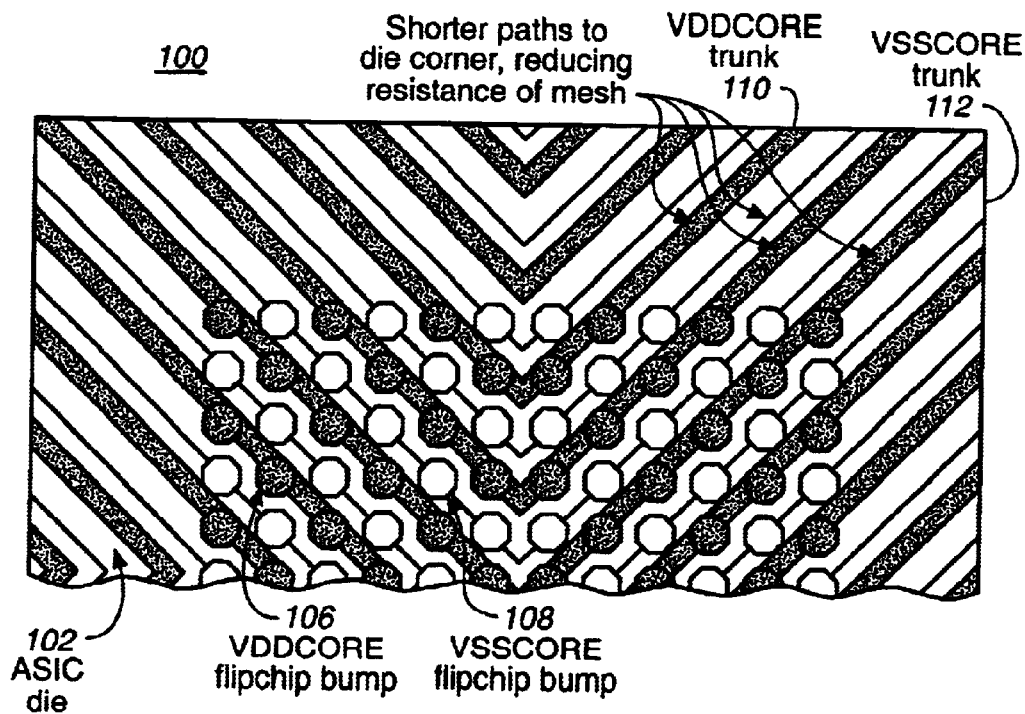
FIG._7

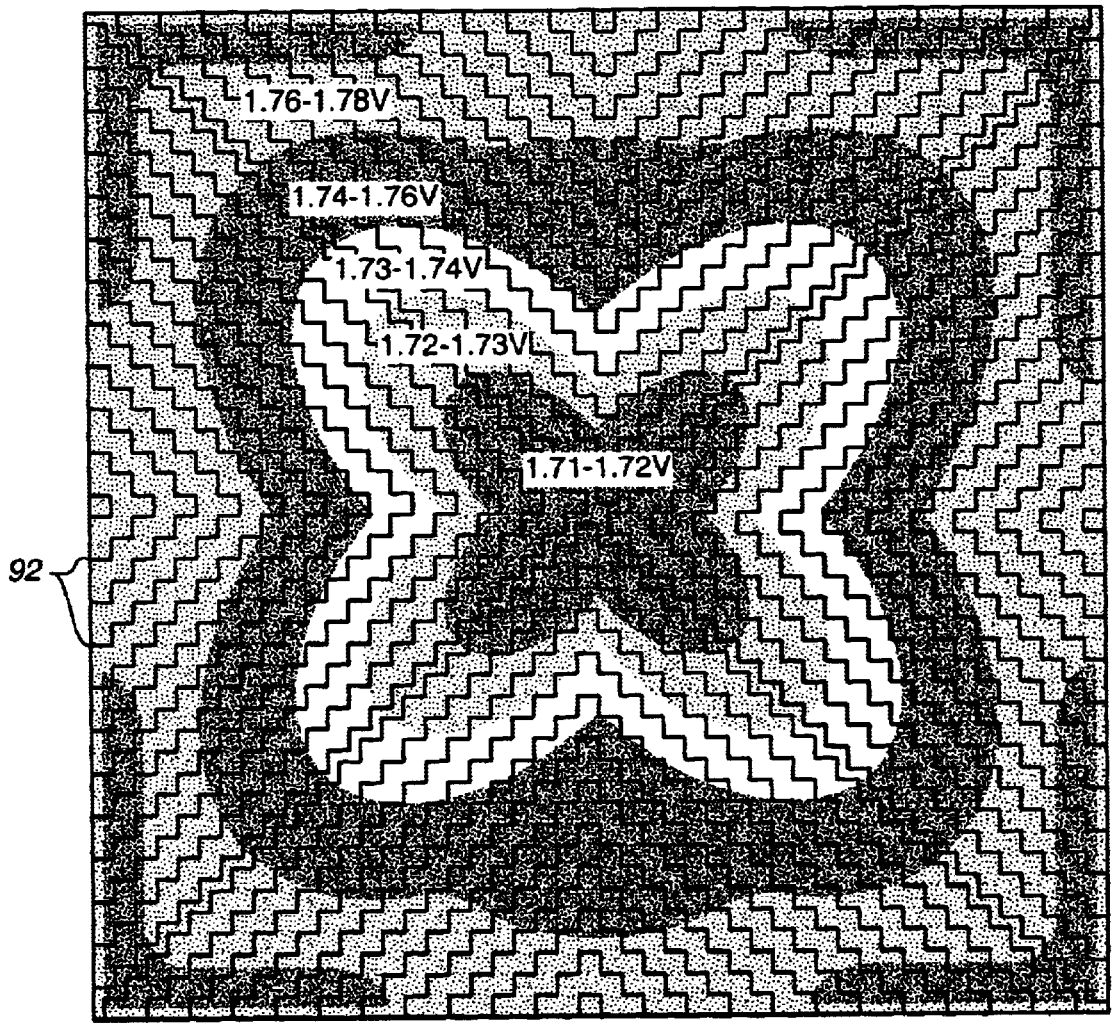
FIG._6

DIE POWER DISTRIBUTION SYSTEM

FIELD OF THE INVENTION

The present invention relates to power mesh designs for semiconductor devices, and more particularly to a power distribution system for high power consumption, high pin-count chips designed for use in wire-bond and flip-chip packages.

BACKGROUND OF THE INVENTION

Integrated circuits are typically packaged before they are used as other components as part of a larger electronic system. A ball grid array (BGA) is a popular surface mount chip package that uses a grid of solder balls to connect the package to a printed circuit board. The chips within the package may be wire bond or flip-chips. Wire-bond BGA packages are constructed with die mounted on a substrate with bond pads on the die connected to conductive lines or traces on the surface of the substrate. Flip-chips have solder balls placed on the surface of the chip, and the chip is "flipped" over onto the substrate and connected via the solder balls. One area of concern for BGA packages is power distribution to the die.

FIG. 1 is a top view of a conventional power mesh for redistributing external power across a die. A conventional power distribution system typically uses two metal layers to create a power mesh 10 across a die 12 to supply external power and ground (referred to as VDDCORE and VSSCORE, respectively) to rows of cells 16 within the die 12. Power and ground trunks 12 are placed within the top-metal layer of the die 12 and are usually patterned perpendicular to the rows of cells 16 to permit vias 20 to be placed along the length of the cell rows 16 at regular intervals. In order to provide uniform distribution across the die 12, the metal layer below the top layer also includes power and ground trunks 18, which are patterned parallel to the cell rows 16. This second layer of trunks 18 is connected to the top metal layer trunks 14 using vias 22.

Referring now to FIG. 2, the traditional power mesh system of FIG. 1 is shown in a wire bond ASIC implementation. In the wire bond implementation, an even distribution of VDDCORE and VSSCORE bond pads 30 and 32 is required around the periphery of the die 12 for receiving external power and ground, respectively. I/O signal bond pads 34 are also placed along the periphery of the die 12 for connection with I/O signal lines 36.

Although the traditional power mesh system is well automated within design tools and also provides uniform power distribution across die, the conventional power mesh system includes several drawbacks. First, the power mesh 10 requires at least two metal layers to pattern the perpendicular VDDCORE and VSSCORE trunks 14 and 18. Unfortunately, the layer below the top metal layer is a routing resource that could be used for signal routing rather than for power routing, which could result in smaller die 12 sizes.

Second, the interior of the die 12 may experience a voltage drop due to the length of the VDDCORE and VSSCORE trunks 14 and 18. For example, assuming that the external power source is 5 V, then the die 12 may experience a 5V–10% drop at the center.

Third, requiring uniform placement of VDDCORE and VSSCORE bond pads 30 and 34 is not ideal from an I/O placement perspective because the uniform placement of the power bond pads require that more I/O signal bond pads 34 be placed towards the corners of the die 12. When I/O signals are forced to the corners of the die 12 in order to connect to the signal I/O bond pads 34, a mismatch between bond wire length and package trace lengths is created, which may cause skew on wide I/O signal lines 36.

The traditional power mesh system 10 also has disadvantages when used in flip-chip implementations, as shown in FIG. 3. FIG. 3 is a top view of a power mesh 10' used in a conventional flip-chip ASIC implementation. FIG. 3 is a more detailed view showing that each trunk on the top metal layer actually includes a separate VDDCORE trunk 14a and VSSCORE trunk 14b, and each trunk on the layer beneath the top layer also includes a VDDCORE trunk 18a and VSSCORE trunk 18b.

As stated above, the top metal layer in flip-chips is reserved for I/O to flip-chip solder bump connections, which include VDDCORE bumps 40 and VSSCORE bumps 42. However, the traditional power mesh 10' also uses the top metal layer. Therefore, when the traditional power mesh 10' is used with a flip-chip, routing on the top metal layer becomes very congested. For core limited designs, use of a two metal layer power mesh 10' constrains routing.

In addition, the VDDCORE bumps 40 and VSSCORE bumps 42 are not necessarily evenly distributed across the die 12'; they are usually located on the center of the die 12' and the power mesh 10 must distribute current from the bumps 40 and 42 to the corners of the die 12'. Because via connections 22' are used to carry current from the center of the die 12' towards the corners of the die 12' in a staircase fashion across the orthogonal mesh power mesh 10', additional resistance and routing blockages may be introduced. Furthermore, potential IR drops may also occur if there are large current sinks 44 at the die corners.

Accordingly, what is needed is an approved single-layer power mesh that achieves symmetry in power distribution both within the die and through the power pads. The present invention addresses such a need.

SUMMARY OF THE INVENTION

The present invention provides a system and method for distributing external power across a die, which has horizontal and vertical centerlines. The system and method include providing a power mesh that includes a plurality of V-shaped trunks patterned as concentric diagonal trunks extending from the horizontal and vertical centerlines of the die towards the periphery of the die.

According to the method system disclosed herein, because the trunks are routed diagonally across the die, all the power bond pads can be connected without the need for a second layer, thereby providing a single-layer power mesh. The single-layer power mesh of the present invention achieves symmetry in power distribution both within the die and an even distribution of current flow. In addition, the single-layer power mesh frees a routing resource for signal routing.

BRIEF DESCRIPTION OF THE DRAWINGS

FIG. 1 is a top view of a conventional power mesh on a die for redistributing external power across the die.

FIG. 2 is a top view of a traditional power mesh system with wirebond I/O placement limitations.

FIG. 3 is a top view of a power mesh in a conventional flip-chip ASIC implementation.

FIG. 4 is a top view of a V-shaped power mesh for redistributing external power across a die in accordance with a preferred embodiment of the present invention.

FIG. 5 is a block diagram illustrating the V-shaped power mesh system in a wire bond implementation.

FIG. 6 is a top view of a single-layer V-shaped power mesh that routes V-shaped trunks in a stair-step arrangement across the die.

FIG. 7 is a diagram illustrating the V-shaped power mesh in a flip-chip implementation.

DETAILED DESCRIPTION

The present invention relates to providing a power mesh for redistributing external power across a die. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention comprises using only one layer, preferably the top metal layer, for a power mesh, while achieving an even distribution of the current flow and also freeing layers beneath the top metal layer as a routing resource. Rather than providing the power mesh as two perpendicular layers of trunks connected between bond pads on opposite sides of the die, the present invention provides a single-layer power mesh built from concentric diagonal trunks extending from the die's centerlines toward the sides of the die.

Referring now to FIG. 4, a top view of a V-shaped power mesh 50 for redistributing external power across a die is shown in accordance with the first preferred embodiment of the present invention. The die 51 is shown having four-sides and a horizontal centerline 52 and a vertical centerline 54. According to the present invention, the V-shaped VDDCORE trunks 56 and VSSCORE trunks 58 extend from the centerlines 52 and 54 to the four sides of the die 51 in a rotationally symmetric pattern. The V-shaped VDDCORE trunks 56 and VSSCORE trunks 58 regularly intersect cell rows 60 where vias 62 may be used for connection. The V-shaped trunks 56 and 58, which extend to all four sides of the die 51, provide distributed coverage across the die, including the die corners. In addition, the trunks 56 and 58 are routed diagonally across the die 51, all the power bond pads can be connected without the need for a second layer.

FIG. 5 is a block diagram illustrating the V-shaped power mesh system in a wire bond implementation. In a preferred embodiment, the V-shaped VDDCORE and VSSCORE trunks 56 and 58 connect to VDDCORE and VSSCORE power pads 64 and 66, respectively, that are located on substantially the same side of the die 51 to provide robust power connections to the corners of the die 51 where IR drop has traditionally been a problem. Accordingly, the present invention requires only a few VDDCORE and VSSCORE bond pads 64 and 66. Moving toward each corner of the die 51, the number of VDDCORE and VSSCORE bond pads 64 and 66 must be progressively increased to handle the increasingly longer trunk lengths. In this manner, the VDDCORE and the VSSCORE bond pads 64 and 66 are progressively biased towards each corner of the die 51, allowing signal I/O bond pads 68 to occupy most of the center of the die's periphery for connection with signal I/O bond wires 70. Biasing the I/O bond pads 68 towards the center results in a fewer number of mismatched I/O signals across the die 51 and reduces skew for wide I/O bond wires 70.

Some types of fabrication tools may be incapable of patterning straight-line diagonal metal layers. Therefore, as shown in FIG. 6, the second preferred embodiment of the present invention provides a single-layer V-shaped power mesh 90 that routes the V-shaped trunks 92 in a stair-step arrangement across the die. Alternatively, the stair-step trunks may be patterned using two metal layers; one layer may be used for the vertical segments of the stair-step, and the second layer for the horizontal segments of the stair-step.

FIG. 6 also illustrates an IR drop map for a 12.2×12.2 mm wirebond implementation resulting from the use of the single layer V-shaped power mesh 90. An IR drop analysis was performed based on 1.8V core voltage at 11 watts using 76 VDDCORE and 76 VSSCORE bond pads. The worst-case IR drop occurred at the die center, but was within a 5% margin of the 1.8V core supply and could be further reduced with a much thicker redistribution layer.

FIG. 7 is a diagram illustrating a V-shaped power mesh 100 in a flip-chip implementation. An ASIC die 102 is shown, which includes VDDCORE flip-chip bumps 106 and VSSCORE flip-chip bumps 108. The flip-chip bumps 106 and 108 are located primarily in the center of the die 102 as normal, but the VDDCORE flip-chip bumps 106 are placed along the paths of the VDDCORE trunks 110, and the VSSCORE flip-chip bumps 108 are placed along the paths of VSSCORE trunks 112.

For flip-chip ASICs, the V-shaped VDDCORE and VSSCORE trunks 110 and 112 provide a more direct connection to each corner of the die 100, where VDDCORE and VSSCORE bumps 106 and 108 are not typically present. The shorter path to the die corner reduces the path resistance and therefore the voltage drop.

The V-shaped power mesh of the present invention will achieve an even distribution of the current flow over power contact points of the die, such as power pads and flip-chip bumps, and avoids potential electromigration issues. Also, because the trunks are routed diagonally, the V-shaped power mesh requires only one layer of metal to connect all the power bond pads. Since the layer underneath the top metal layer is no longer used for the power mesh, an additional routing resource will be freed for chip level routing. In conventional two-layer power mesh designs, up to 20% of the layer beneath the top layer is used to support the power mesh. In the present invention, this same amount is freed for signal routing, resulting in a die size reduction.

A power distribution method and system has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A power distribution system for a die, comprising:
   a die having horizontal and vertical centerlines;
   a plurality of V-shaped trunks patterned as concentric diagonal trunks extending from the horizontal and vertical centerlines of the die towards the periphery of the die; and
   a plurality of power bond pads located around the die's periphery, wherein the power bond pads are progressively biased towards each corner of the die, thereby allowing signal I/O bond pads to occupy most of the center of the die's periphery for connection with signal I/O bond wires.

2. The power distribution system of claim 1 wherein the V-shaped trunks are patterned using a single metal layer.

3. The power distribution system of claim 1 wherein the V-shaped trunks are patterned in a stair-step arrangement across the die.

4. The power distribution system of claim 2 wherein each of V-shaped trunks includes a power trunk and a ground trunk.

5. The power distribution system of claim 3 wherein the stair-step V-shaped trunks are patterned using two metal layers, such that vertical segments are patterned on one metal layer and the horizontal segments are patterned on a second metal layer.

6. The power distribution system of claim 4 wherein the V-shaped trunks comprise VDDCORE trunks and VSSCORE trunks.

7. The power distribution system of claim 5 wherein the die includes VDDCORE flip-chip bumps and VSSCORE flip-chip bumps located primarily in the center of the die, wherein the VDDCORE flip-chip bumps are placed along the paths of the VDDCORE trunks, and the VSSCORE flip-chip bumps are placed along the paths of VSSCORE trunks.

8. A method for distributing power across a semiconductor die, the die having horizontal and vertical centerlines, the method comprising:
   (a) patterning a plurality of V-shaped trunks patterned as concentric diagonal trunks extending from the horizontal and vertical centerlines of the die towards the periphery of the die;
   (b) locating signal I/O bond pads and power contact points around the die's periphery, wherein the signal I/O bond pads are progressively biased towards each corner of the die; and
   (c) coupling the plurality of V-shaped trunks to power contact points on the die, thereby allowing the signal I/O bond pads to occupy most of the center of the die's periphery for connection with signal I/O bond wires.

9. The method of claim 8 further including the step of patterning the V-shaped trunks in a single-layer metal layer.

10. The method of claim 9 further including the step of patterning the V-shaped trunks in a stair-step configuration.

11. The method of claim 9 further including the step of providing each of V-shaped trunks with a power trunk and a ground trunk.

12. The method of claim 11 further including the step of utilizing the die in a flip-chip implementation having VDDCORE flip-chip bumps and VSSCORE flip-chip bumps located primarily in the center of the die, wherein the VDDCORE flip-chip bumps are placed along the paths of the power trunks, and the VSSCORE flip-chip bumps are placed along the paths of ground trunks.

13. The method of claim 11 further including the step of utilizing the die in a wire bond implementation wherein bond pads are located around the die's periphery, and patterning the V-shaped trunks such that the V-shaped trunks located on a particular side of the die are connected between respective pairs of bond pads that are located on the same side of the die.

14. A power distribution system for a die in a wire bond implementation, comprising:
   a die having multiple sides and horizontal and vertical centerlines;
   a plurality of signal I/O bond pads and power bond pads located along each of the sides, the power bond pads for receiving an external power signal; and
   a plurality of V-shaped trunks patterned as concentric diagonal trunks extending from the horizontal and vertical centerlines of the die between respective pairs of power bond pads that are located on the same side of the die, wherein the power bond pads are progressively biased towards each corner of the die, thereby allowing the signal I/O bond pads to occupy most of the center of the die's periphery for connection with signal I/O bond wires.

* * * * *